United States Patent
Sridhar

(10) Patent No.: US 9,196,728 B2
(45) Date of Patent: Nov. 24, 2015

(54) LDMOS CHC RELIABILITY

(71) Applicant: Texas Instruments Incorporated, Dallas, TX (US)

(72) Inventor: Seetharaman Sridhar, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/557,648

(22) Filed: Dec. 2, 2014

(65) Prior Publication Data

US 2015/0187937 A1    Jul. 2, 2015

Related U.S. Application Data

(60) Provisional application No. 61/922,125, filed on Dec. 31, 2013.

(51) Int. Cl.

| H01L 21/762 | (2006.01) |
|---|---|
| H01L 29/78 | (2006.01) |
| H01L 29/66 | (2006.01) |
| H01L 29/08 | (2006.01) |
| H01L 29/06 | (2006.01) |
| H01L 29/04 | (2006.01) |
| H01L 21/3105 | (2006.01) |
| H01L 21/311 | (2006.01) |

(52) U.S. Cl.
CPC ...... *H01L 29/7835* (2013.01); *H01L 21/31053* (2013.01); *H01L 21/31111* (2013.01); *H01L 21/76224* (2013.01); *H01L 29/045* (2013.01); *H01L 29/0653* (2013.01); *H01L 29/0847* (2013.01); *H01L 29/66659* (2013.01)

(58) Field of Classification Search
CPC ............ H01L 21/76224; H01L 21/31111; H01L 21/31053; H01L 21/26513; H01L 29/0653; H01L 29/7835; H01L 29/66659; H01L 29/0847; H01L 29/045; H01L 29/16
See application file for complete search history.

(56) References Cited

U.S. PATENT DOCUMENTS

| 6,350,662 | B1 * | 2/2002 | Thei et al. | 438/435 |
|---|---|---|---|---|
| 6,656,783 | B2 * | 12/2003 | Park | 438/221 |
| 7,501,686 | B2 * | 3/2009 | Okuno et al. | 257/369 |
| 8,987,860 | B2 * | 3/2015 | Song et al. | 257/522 |
| 9,059,243 | B2 * | 6/2015 | Doris et al. | 1/1 |
| 2005/0167778 | A1 * | 8/2005 | Kim et al. | 257/510 |
| 2007/0158780 | A1 * | 7/2007 | Chang | 257/500 |
| 2008/0173940 | A1 * | 7/2008 | Miller et al. | 257/339 |
| 2008/0224274 | A1 * | 9/2008 | Yamazaki et al. | 257/627 |
| 2009/0140334 | A1 * | 6/2009 | Chang | 257/336 |
| 2011/0089474 | A1 * | 4/2011 | Fukutome | 257/288 |
| 2013/0334651 | A1 * | 12/2013 | Doris et al. | 257/506 |
| 2014/0099775 | A1 * | 4/2014 | Sun | 438/437 |
| 2015/0097248 | A1 * | 4/2015 | Liou et al. | 257/396 |
| 2015/0187767 | A1 * | 7/2015 | Grisham et al. | 257/401 |
| 2015/0221722 | A1 * | 8/2015 | Sawada et al. | 257/390 |

\* cited by examiner

*Primary Examiner* — Allan R Wilson
(74) *Attorney, Agent, or Firm* — Jacqueline J. Garner; Frank D. Cimino

(57) ABSTRACT

An integrated circuit on a rotated substrate with an LDMOS transistor. A method of enhancing the CHC performance of an LDMOS transistor by growing a second STI liner oxide. A method of enhancing the CHC performance of an LDMOS transistor building the LDMOS transistor on a rotated substrate and growing a second STI liner oxide.

15 Claims, 6 Drawing Sheets

LDMOS CHC RELIABILITY

CROSS-REFERENCE TO RELATED APPLICATIONS

This application claims the benefit of priority under U.S.C. §119(e) of U.S. Provisional Application 61/922,125.

FIELD OF THE INVENTION

This invention relates to the field of integrated circuits. More particularly, this invention relates to integrated circuits with LDMOS transistors.

BACKGROUND OF THE INVENTION

Many integrated circuits require transistors capable of switching high voltages that may be 10 volts or more in addition to the core transistor logic that switch at nominal voltages such as 1.0 or 1.5 volts. Adding high voltage transistors to a baseline CMOS process flow often incurs additional process complexity which raises cost.

One solution is to utilize lightly doped drain MOS (LDMOS) transistors. (sometimes referred to as drain extended or DEMOS transistors) which can switch high voltages and can be formed using a baseline CMOS process flow with no additional processing steps. LDMOS transistors may be either n-type (LDNMOS) or p-type (LDPMOS).

As the voltage at which a LDNMOS transistor switches is raised, the acceleration of electrons in the channel is increased resulting in the generation of channel hot carriers (CHC). These hot carriers may have sufficient energy to overcome the substrate/gate dielectric barrier and maybe injected into or through the gate dielectric and also may damage the substrate/gate dielectric interface near the drain end of the LDNMOS channel when the LDNMOS transistor is on. Some of these hot carriers may get trapped in the gate dielectric forming trapped charge. Some of these hot carriers may damage the substrate/gate dielectric interface forming charged interface states. These trapped charges and charged interface states may build up over time causing the turn on voltage of the transistor to increase over time. The increase in turn on voltage and transistor resistance may degrade the transistor performance to the extent that the circuit may fail. In addition, the current of CHC electrons through the gate dielectric degrades the dielectric over time to the point where it may fail causing the integrated circuit to fail.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit with improved LDMOS CHC reliability is formed on a <110> substrate. The CHC performance of an LDMOS transistor is improved by growing a second STI liner oxide. The CHC performance of an LDMOS transistor is enhanced by building the LDMOS transistor on a rotated, <110>, substrate and growing a second STI liner oxide.

DETAILED DESCRIPTION

Figure 1:
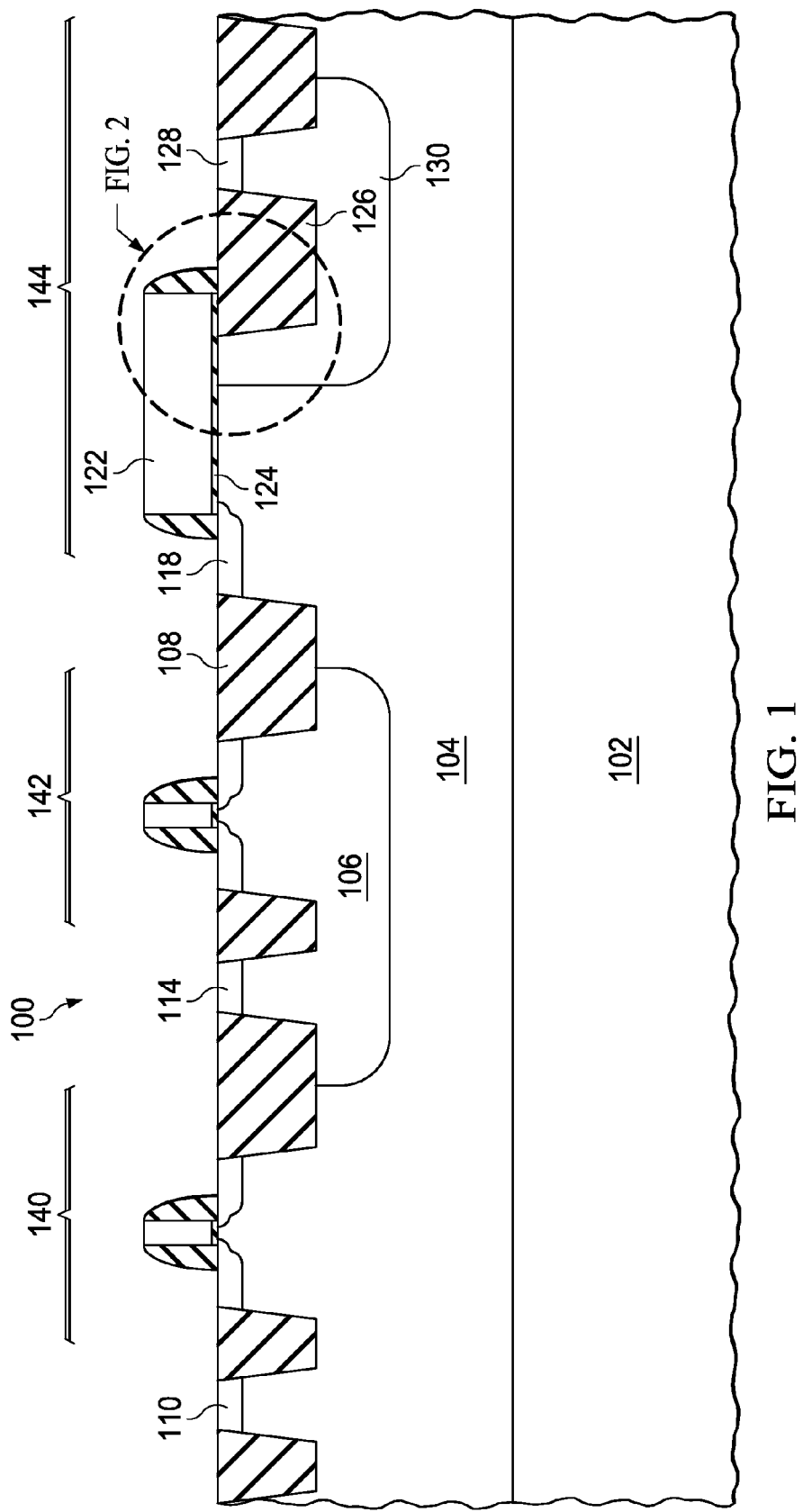
FIG. 1 is a cross-section of a LDNMOS transistor according to an embodiment.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

FIG. 1 is an example of an integrated circuit 100 including an LDNMOS transistor 144 with improved channel hot carrier (CHC) lifetime. The integrated circuit 100 includes an NMOS transistor 140, a PMOS transistor 142, and a LDNMOS transistor 144. A layer of p-epi 104 is formed on a p-substrate 102. Shallow trench isolation (STI) areas 108 and 126 electrically isolate active areas where the transistors 140, 142 and 144 are formed. NMOS transistor 140 is formed in the p-epi 104. P-epi substrate contact 110 provides a means of controlling the potential of the substrate 104. PMOS transistor 142 is formed in an nwell 106 which is formed in the p-epi 104 layer. Nwell substrate contact 114 provides a means of controlling the potential of the nwell 106. LDNMOS transistor 144 is built in the p-epi 104 layer. The source of the LDNMOS is n-type diffusion 118 and the drain of the LDNMOS is the lightly doped extended drain 130 and the heavily doped n-type diffusion 128. The lightly doped (extended) drain 130 of the LDNMOS transistor 144 may be formed at the same time and by the same implant as the nwell 106. The lightly doped drain 130 is sufficiently lightly doped so that the portion under the STI geometry 126 is completely depleted of carriers when voltage is applied to the drain contact 128. Sufficient voltage is dropped across the depleted region between the drain contact 128 and the gate dielectric 124 so that the same gate dielectric may be used to switch the low voltage NMOS 140 and PMOS 142 transistors and to switch the high voltage LDNMOS 144 transistor.

When a high positive voltage is applied to the LDNMOS drain 128 and a positive voltage is applied to the gate 122 of the LDMOS transistor 144, the LDNMOS transistor turns on and electrons flow from the source 118 to the drain 128 through the lightly doped extended drain 130. The electric field peak is under the drain end of the gate 122 where the gate dielectric transitions from the thin gate oxide 124 over the lightly doped drain 130 diffusion to the thicker STI oxide 126. The strength of the electric field peak determines the rate of CHC formation and the energy of the CHC electrons.

In a typical LDMOS transistor the top corner 402 (FIG. 3A) between the channel and the STI oxide is fairly sharp which enhances the strength of the electric field peak. The electric field peak leads to increased channel hot carrier (CHC) generation. As the strength of electric field peak is increased more channel hot carries and higher energy channel hot carriers are generated. Some of the channel hot carriers break bonds at the gate oxide 124 lightly doped drain 130 interface causing charged interface states to form. Other channel hot carriers with sufficient energy to get injected into and trapped in the gate dielectric 124 resulting in additional build up of charge. Channel hot carriers with sufficient energy to be injected through the gate dielectric break silicon dioxide bonds resulting in early wearout of the gate dielectric. Build up of charge due to interface states and trapped charge may raise the Vt of the LDNMOS transistor to the point that it fails to turn on. The gate dielectric 124 may also be degraded by CHC to the point that the gate dielectric fails.

Figure 2:
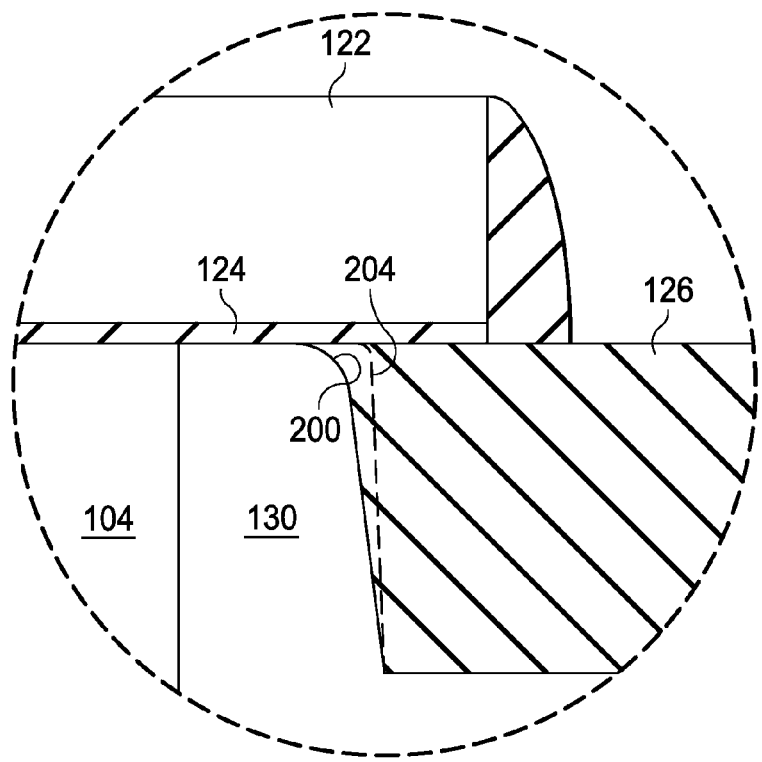
FIG. 2 is a cross-section of the upper corner of STI isolation under the gate of a LDMOS transistor formed according to embodiments.

As shown in FIG. 2, the rounding 200 of the top STI active corner is increased to produce a more gradual change of dielectric thickness where the gate dielectric 124 transitions between the lightly doped diffusion 130 and the STI dielectric 126. This corner rounding 200 reduces the peak electric field in this area resulting in reduced CHC generation. The reduced CHC generation improves the reliability and lifetime of the LDNMOS transistor 144.

In one embodiment, LDMOS transistors may be formed on a rotated substrate. Integrated circuits are commonly formed on <100> silicon wafers with the transistor channel in the <110> direction. With a rotated substrate integrated circuits may be formed on <110> silicon wafers with the transistor channel is in the <100> direction. The oxidation of silicon at the upper STI active corner 200 during shallow trench isolation (STI) liner oxidation on a <110> substrate is unexpectedly enhanced over the oxidation of the corner when STI trenches are formed in the <100> substrates. The dashed curve 204 in FIG. 2 illustrates corner rounding typical of oxidation on a <100> substrate. Corner 200 illustrates the enhanced corner rounding on a <110> silicon substrate. This additional corner rounding results in reduction of the peak electric field at this STI corner. This reduction in peak electric field improves the channel hot carrier lifetime on LDMOS transistors.

As shown in Table 1, changing from a <100> silicon substrate to a rotated <110> silicon substrate increases the CHC lifetime of a 20V LDNMOS by more than 30 fold in the example embodiment.

TABLE 1

| Substrate | normalized lifetime of a 20 V LDNMOS transistor |
|---|---|
| <100> silicon + 1 step liner ox | 1 |
| <110> silicon + 1 step liner ox | ~33 |
| <110> silicon + 2 step STI liner ox | ~66 |

In another embodiment the CHC lifetime of LDNMOS transistors may be increased with a two step liner oxidation as shown in FIGS. 3A through 3H.

Figure 3A:
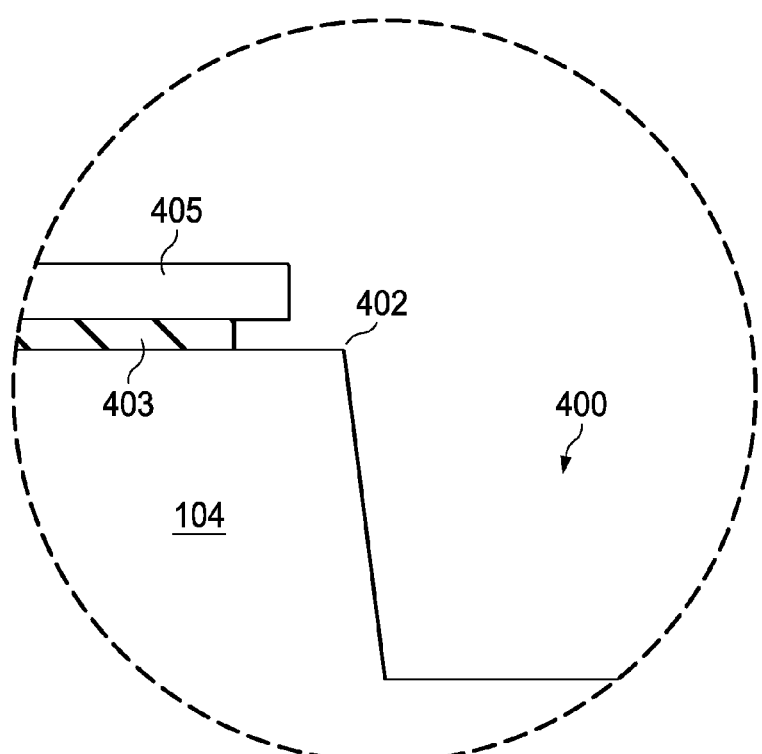
FIGS. 3A-3H illustrate the major manufacturing steps in forming an LDNMOS transistor according to embodiments.

FIG. 3A shows the top corner 402 of a STI trench after the STI trench 400 is etched into the substrate 104 of the integrated substrate 100. Pad oxide 403 and pad nitride 405 form the mask for the STI trench etch. The nitride layer 405 and the pad oxide layer 403 are etched back from the STI corner 402 in the usual manner to expose the corner to facilitate oxidation of the corner. The top corner 402 of an STI trench 400 is shown in FIG. 3A after the STI trench 400 is etched into the substrate 104 of an integrated circuit.

Figure 3B:
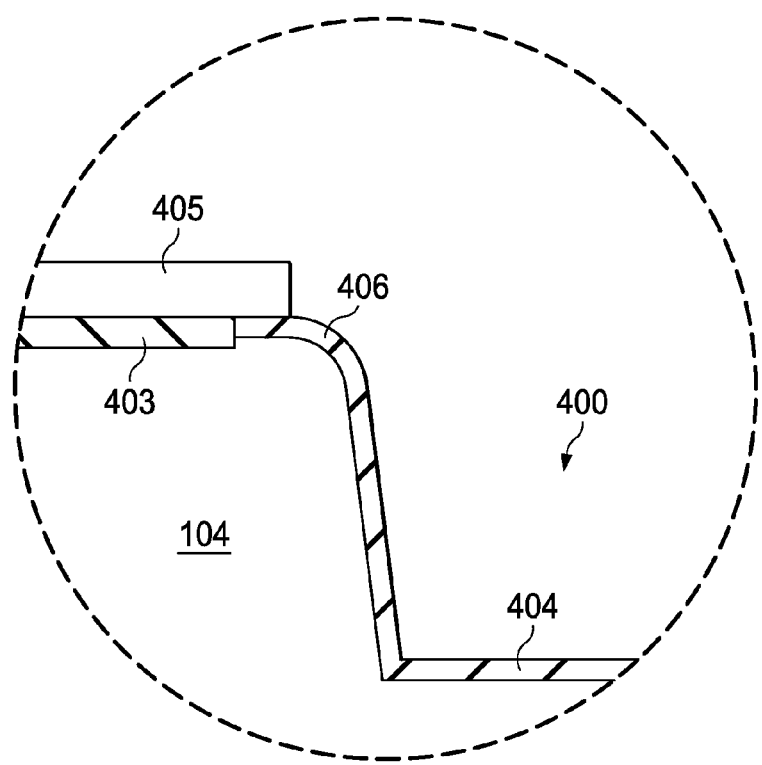

In FIG. 3B a first STI liner oxidation grows liner oxide 404 on the surface of the integrated circuit wafer and on the sidewalls and bottom wall of the STI trench 400. This oxidation rounds the top corner 406 of the STI trench 400. In an embodiment integrated circuit with a LDNMOS transistor with improved CHC lifetime the first STI liner oxidation grows between 2 nm and 50 nm oxide with a temperature in the range of 700° C. to 1150° C. and in a steam or dry $O_2$ ambient containing HCl or chlorine.

Figure 3C:
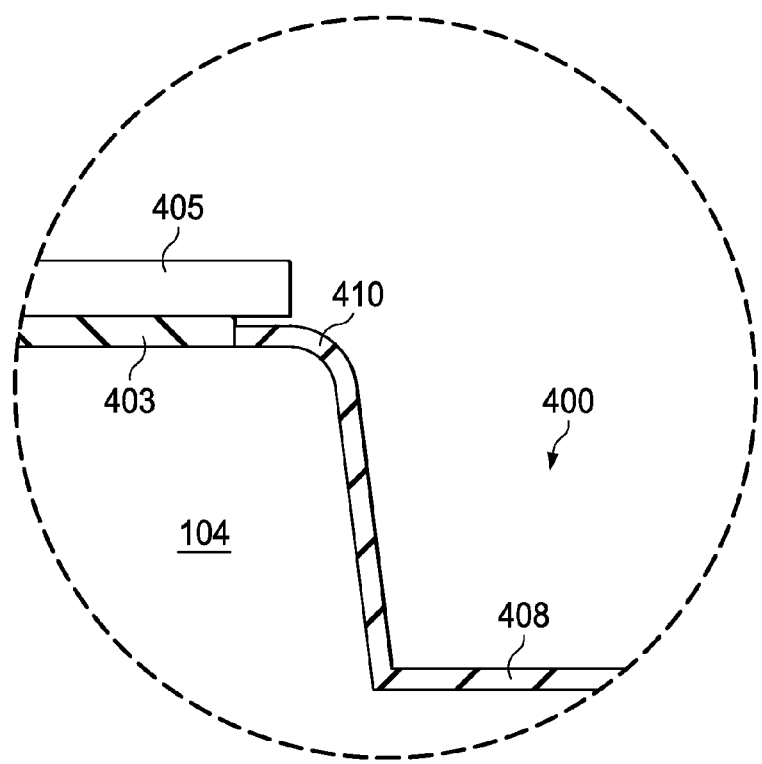

Referring now to FIG. 3C either a portion or all of the first STI oxide 404 is deglazed using a dilute HF solution and a second STI liner oxide 408 is grown. As shown in FIG. 3C, the second liner oxide 408 additionally rounds the top corner 410 of the STI trench 400. This additional rounding further modifies the peak electric field in this region additionally reducing CHC generation.

In an embodiment integrated circuit with a LDNMOS transistor with improved CHC lifetime, the second STI oxide is grown to a thickness between 5 nm and 50 nm with a temperature in the range of 700° C. to 1150° C. and in a steam or dry $O_2$ ambient containing HCl or chlorine.

Figure 3D:
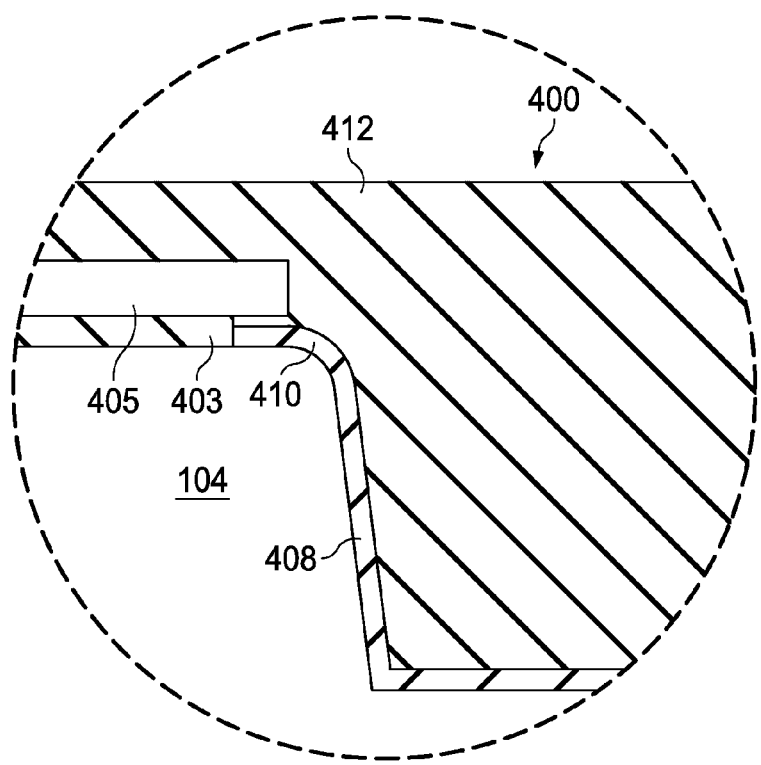

In FIG. 3D the STI trench 400 is filled with a STI dielectric 412 such as high density plasma (HDP) oxide or high aspect ratio (HARP) oxide.

Figure 3E:
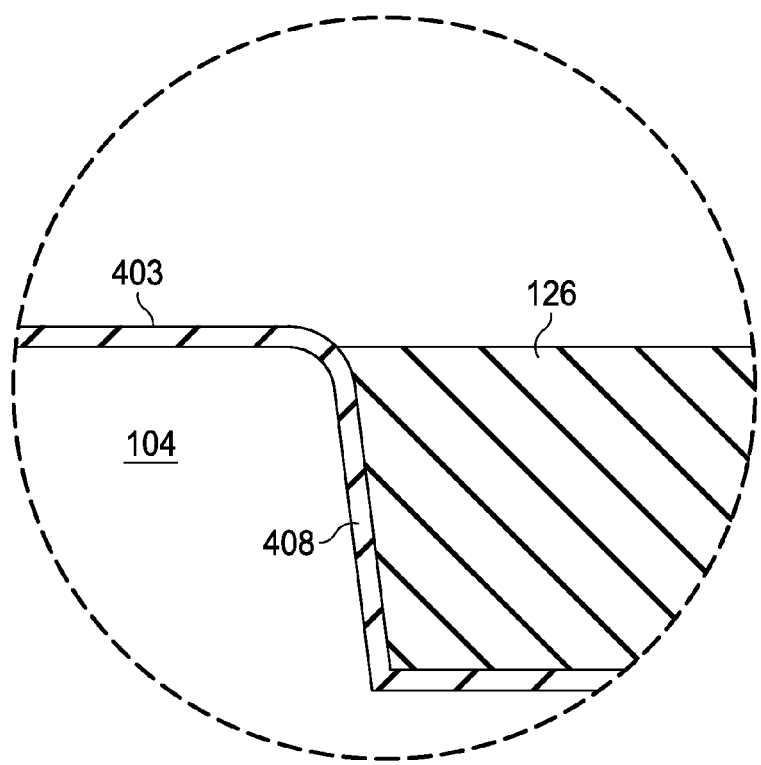

The STI dielectric is planarized using CMP as shown in FIG. 3E to form STI dielectric geometry 126. The nitride layer 405 is removed using a hot phosphoric etch.

Figure 3F:
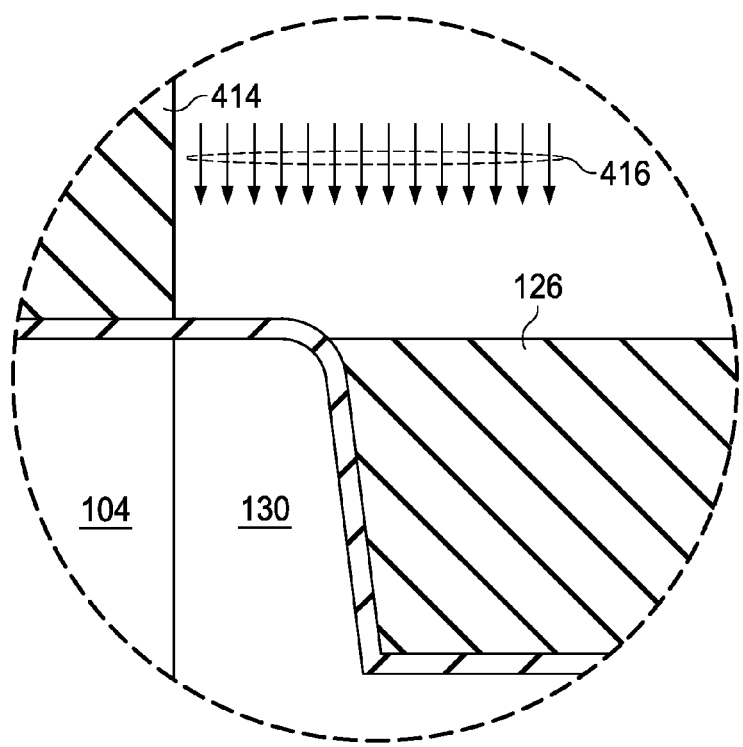

In FIG. 3F a lightly doped drain photo resist pattern 414 is formed on the integrated circuit and dopant 416 is implanted to form the lightly doped drain diffusion 130 of the LDNMOS transistor.

Figure 3G:
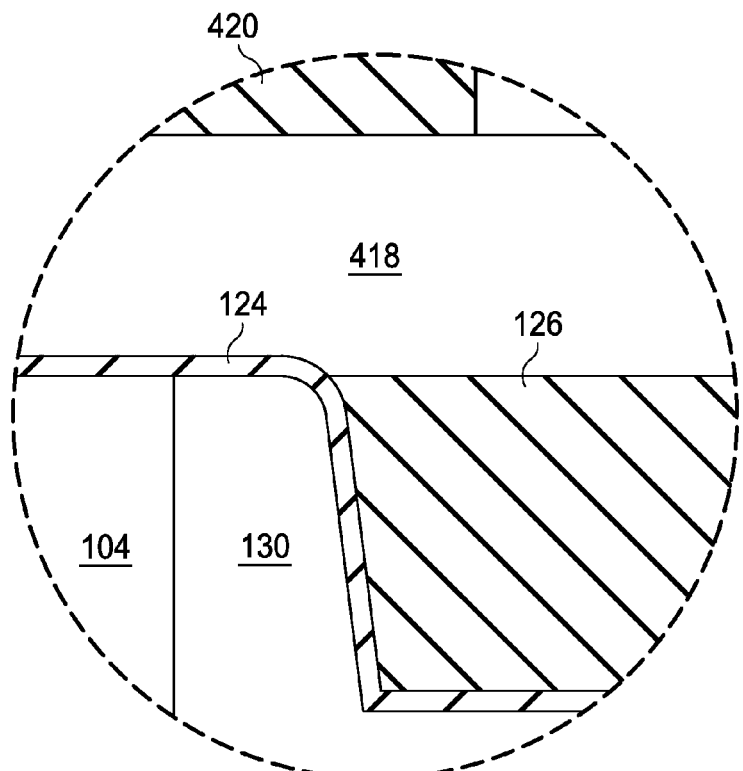

In FIG. 3G the pad oxide 403 is striped and gate dielectric 124 is grown. Gate material 418 is deposited and a gate photo resist pattern 420 is formed on the gate material 418.

Figure 3H:
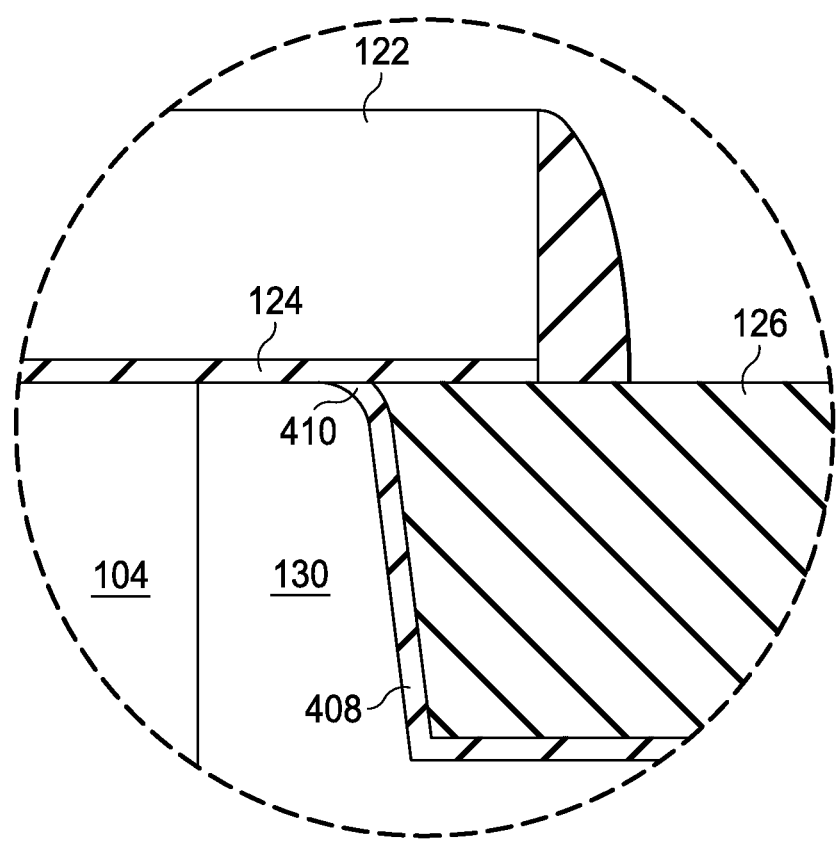

FIG. 3H shows the drain region of a LDNMOS transistor 100 with improved CHC lifetime. The enhanced corner rounding 410 where the gate 122 crosses from the lightly doped drain 130 with thin gate dielectric 124 to the STI geometry 126 with thick STI dielectric significantly reduces the peak electric field in this region. This reduction in the peak electric field results in a significant reduction in hot carrier generation.

In an example embodiment the first STI liner oxidation grows 11 nm oxide at 800° C. in a steam plus HCl ambient. After deglazing 2 nm oxide using 0.5% HF a second STI liner oxidation grows 17.5 nm oxide in a dry $O_2$ plus HCl ambient at 900° C.

In yet another embodiment the LDMOS transistor with improved CHC lifetime is formed on a rotated, <110>, substrate and additionally performing the two step STI liner oxidation. Since additional corner rounding is realized when corners of the rotated, <100>, substrate are oxidized, more corner rounding and consequently additional CHC lifetime improvement is realized than when the two step liner oxidation is performed on a non-rotated, <100>, substrate.

By combining the rotated, <110>, substrate with the 2 step STI liner oxidation, the CHC lifetime may be improved about 66 times over non rotated substrate plus single step STI liner oxidation and about double the lifetime of a 1 step STI liner oxidation on a rotated substrate as shown in TABLE 1.

While the above embodiments are illustrated using LDNMOS transistors, the channel hot carrier reliability of LDPMOS transistors may also benefit from the above embodiments.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A process of forming an integrated circuit, comprising the steps:
   forming an STI trench pattern on a substrate of the integrated circuit;
   etching an STI trench into the substrate;
   growing a first STI liner oxide on an upper active corner of the STI trench;
   stripping a portion of the first STI liner oxide using dilute HF; and
   growing a second STI liner oxide on the upper active corner of the STI trench.

2. The process of claim 1, wherein the substrate is <100> silicon.

3. The process of claim 1, wherein the substrate is <110> silicon.

4. The process of claim 1, wherein the first STI liner oxide thickness is in the range of 2 nm and 50 nm, the first STI liner oxide is grown in an ambient of steam or dry $O_2$ with HCl or chlorine, and the first STI liner oxide is grown at a temperature in the range of 700° C. to 1100° C.

5. The process of claim 1, wherein the second STI liner oxide thickness is in the range of 5 nm and 50 nm and wherein the second STI liner oxide is grown in an ambient of steam or dry $O_2$ with HCl or chlorine and is grown at a temperature in the range of 700° C. to 1100° C.

6. A process of forming an integrated circuit, comprising the steps:
   forming an STI trench pattern on a substrate of the integrated circuit;
   etching an STI trench into the substrate;
   growing a first STI liner oxide;
   stripping a portion of the first STI liner oxide using dilute HF;
   growing a second STI liner oxide;
   wherein the first STI liner oxidation grows 11 nm oxide at 800° C. in steam plus HCl, and where 2 nm of the first STI liner oxide is deglazed using 0.5% HF, and where the second STI liner oxidation grows 17.5 nm oxide in dry $O_2$ plus HCl at 900° C.

7. A process of forming an integrated circuit, comprising the steps:
   forming an STI trench pattern on a substrate of the integrated circuit;
   etching an STI trench into the substrate;
   growing a first STI liner oxide;
   stripping a portion of the first STI liner oxide using dilute HF;
   growing a second STI liner oxide;
   filling the STI trench with STI dielectric;
   planarizing the STI dielectric to form a STI geometry;
   forming a lightly doped drain photo resist pattern on the integrated circuit with an opening that contains the STI trench;
   implanting dopant to form a lightly doped drain where the lightly doped drain contains the STI geometry;
   growing a gate oxide on the lightly doped drain and on the substrate; and
   forming a gate of a LDMOS transistor wherein the gate overlies the transition region from gate oxide on the lightly doped drain to the STI dielectric.

8. The process of claim 7, wherein the substrate is p-type, the lightly doped drain is n-type and the LDMOS transistor is an LDNMOS transistor.

9. The process of claim 7, wherein the substrate is n-type the lightly doped drain is p-type and the LDMOS transistor is a LDPMOS transistor.

10. A process of forming an integrated circuit, comprising the steps:
    providing a <110> substrate for the integrated circuit;
    forming an STI trench pattern on a substrate of the integrated circuit;
    etching an STI trench into the substrate;
    growing a first STI liner oxide on an upper active corner of the STI trench;
    stripping a portion of the first STI liner oxide using dilute HF;
    growing a second STI liner oxide on the upper active corner;
    filling the STI trench with STI dielectric;
    planarizing the STI dielectric to form an STI geometry;
    forming a lightly doped drain photo resist pattern on the substrate with an opening that contains the STI geometry;
    implanting dopant to form a lightly doped drain where the lightly dope drain contains the STI geometry;
    growing a gate dielectric on the lightly doped drain region adjacent to the STI geometry and on the substrate;
    depositing gate material on the gate dielectric and on the STI geometry;
    forming a gate photoresist pattern on the gate material where a first portion of the gate pattern overlies gate dielectric on the substrate, where a second portion of the gate pattern overlies gate dielectric on the lightly doped drain, and where a third portion of the gate photoresist pattern overlies a portion of the STI geometry;
    etching the gate material to form a gate of an LDMOS transistor; and
    removing the gate photoresist pattern.

11. The process of claim 10, wherein the step of growing the first STI liner oxide grows oxide with a thickness in the range of 2 nm and 50 nm in an ambient of steam or dry $O_2$ with HCl or chlorine and at a temperature in the range of 700° C. to 1100° C.

12. The process of claim 10, wherein the step of growing the second STI liner oxide grows oxide with a thickness is in the range of 5 nm and 50 nm in an ambient of steam or dry $O_2$ with HCl or chlorine and at a temperature in the range of 700° C. to 1100° C.

13. The process of claim 10, wherein the step of growing the first STI liner oxidation grows 11 nm of oxide at 800° C. in steam plus HCl, and where the step of stripping removes 2 nm of the first STI liner oxide using 0.5% HF, and where the step of growing the second STI liner oxidation grows 17.5 nm oxide in dry $O_2$ plus HCl at 900° C.

14. The process of claim 10, wherein the substrate is p-type, the dopant is n-type, the lightly doped drain is n-type, and the LDMOS is an LDNMOS transistor.

15. The process of claim 10, wherein the substrate is n-type, the dopant is p-type, the lightly doped drain is p-type, and the LDMOS is a LDPMOS transistor.

* * * * *